United States Patent
Kobayashi et al.

(10) Patent No.: US 7,224,221 B2
(45) Date of Patent: May 29, 2007

(54) POWER AMPLIFICATION APPARATUS, AND MOBILE COMMUNICATION TERMINAL APPARATUS

(75) Inventors: Tomoo Kobayashi, Tokyo (JP); Shigeo Kusunoki, Kanagawa (JP); Masayuki Shimada, Kanagawa (JP)

(73) Assignees: Sony Ericsson Mobile Communications Japan, Inc., Tokyo (JP); Sony Corporation, Tokyo (JP)

( * ) Notice: Subject to any disclaimer, the term of this patent is extended or adjusted under 35 U.S.C. 154(b) by 115 days.

(21) Appl. No.: 11/050,729

(22) Filed: Feb. 7, 2005

(65) Prior Publication Data

US 2005/0189989 A1 Sep. 1, 2005

(30) Foreign Application Priority Data

Feb. 19, 2004 (JP) ............................ P2004-043589

(51) Int. Cl.
  *H03F 1/14* (2006.01)
  *H03F 3/68* (2006.01)

(52) U.S. Cl. ........................................ 330/51; 330/148
(58) Field of Classification Search ...................... None
  See application file for complete search history.

(56) References Cited

U.S. PATENT DOCUMENTS

| | | | | |
|---|---|---|---|---|
| 5,774,017 A | * | 6/1998 | Adar | 330/51 |
| 5,909,643 A | | 6/1999 | Aihara | 455/127 |
| 5,973,557 A | * | 10/1999 | Miyaji et al. | 330/51 |
| 6,111,459 A | * | 8/2000 | Nishijima et al. | 330/51 |
| 6,351,183 B1 | | 2/2002 | Khabbaz et al. | 330/51 |
| 6,501,331 B2 | * | 12/2002 | Adar | 330/51 |
| 6,591,087 B1 | | 7/2003 | Oda | 455/78 |
| 6,606,483 B1 | * | 8/2003 | Baker et al. | 455/126 |
| 6,927,625 B2 | * | 8/2005 | Yamaguchi | 330/124 R |
| 6,960,959 B2 | * | 11/2005 | Komatsu et al. | 330/295 |
| 7,071,776 B2 | * | 7/2006 | Forrester et al. | 330/129 |

FOREIGN PATENT DOCUMENTS

EP 0 977 354 A1 2/2000

* cited by examiner

*Primary Examiner*—Robert Pascal
*Assistant Examiner*—Krista M. Flanagan
(74) *Attorney, Agent, or Firm*—Oblon, Spivak, McClelland, Maier & Neustadt, P.C.

(57) ABSTRACT

A power amplification apparatus includes, between a first amplification element for amplifying an input signal and a first output terminal, a second amplification element for further amplifying the input signal amplified in the first amplification element to output to the first output terminal, and a first switch element for controlling the second amplification element to be stop condition. Further, between the first amplification element and a second output terminal, a second switch circuit for controlling the supply of an output from the first amplification element to the second output terminal is provided. When outputting a medium power, the operation efficiency of the power amplification apparatus is improved by reducing a power consumption. Thereby, a total operation efficiency of the power amplification apparatus which outputs either the input signal amplified to a large power or the input signal amplified to a medium power by switching is improved.

12 Claims, 5 Drawing Sheets

POWER AMPLIFICATION APPARATUS, AND MOBILE COMMUNICATION TERMINAL APPARATUS

CROSS REFERENCE TO RELATED APPLICATION

This application claims priority from Japanese Priority Document No. 2004-043589, filed on Feb. 19, 2004 with the Japanese Patent Office, which document is hereby incorporated by reference.

BACKGROUND OF THE INVENTION

1. Field of the Invention

The present invention relates to a power amplification apparatus which are suitable for application to a mobile telephone, a PHS phone (Personal Handy-phone System), a PDA apparatus (Personal Digital Assistant) provided with a communication function, and a terminal apparatus such as a note-type personal computer using a communication function, and a mobile communication terminal apparatus.

2. Description of Related Art

Now, in Japan, the number of subscribers using mobile phones has exceeded 70% of the population, and approximately 40% of them are owners of mobile communication terminal apparatus which uses a CDMA (Code Division Multiple Access) technology. In the future, when the demand for these terminals is replaced from PDC (Personal Digital Cellular) terminal apparatus and the like by a mobile communication terminal system based on a W-CDMA (Wideband-CDMA) method, the demand for the mobile communication terminal system is anticipated to grow further.

In a mobile radio communication system using the PDC, CDMA methods or the like, such communication is secured between a mobile terminal and a base station by establishing a radio channel there-between. However, because of a changing communication distance from the base station or due to fading in a transmission path, a signal level will change from time to time. Therefore, in a transmission system of the mobile terminal, it is arranged such that after adjusting a transmission signal to a desired signal level in a power amplifier, the signal is transmitted to the base station.

Conventionally, it has been attempted to improve an efficiency of its operation by use of a DC-DC converter in a power supply of the power amplifier in the transmission system. However, because the DC-DC converter generates a noise, and in addition, large capacity coils are required, there are many problems still to be solved.

On this account, a patent document 1 (Japanese Laid-Open Patent H9-130275) discloses again adjusting method for a transmission signal to achieve an improvement of an operation efficiency in a power amplification apparatus while suppressing unnecessary power consumption by selecting a signal path including signal amplification means having a gain corresponding to a desired signal level among a plurality of signal paths each including signal amplification means having a different gain, by amplifying and outputting the transmission signal with the gain of the signal amplification means of selected signal path, and by stop-controlling the operation of the signal amplification means of non-selected signal paths.

Patent Document 1 (Japanese Laid-Open Patent H9-130275)

However, a recent mobile phone is added with many functions of a so-called application such as a present location detection function with a GPS (Global Positioning System) sensor, a TV signal receiving function, an infrared communication function, a TV telephone function with a camera and the like. Therefore, an occasion of performing a high speed communication with the base station is increasing, and also a period of time for performing this high speed communication is prolonging. Thereby, an average transmission power is increasing to more than 10 mW, and thus it is required more and more to enable to deliver a transmission power which is amplified to a large power without causing any loss.

Further, in case of the technology disclosed in the patent document 1, it is configured to use by switching a plurality of signal amplification means connected in parallel, so that a circuit scale becomes larger, and it tends to be a multi-chip form in case of implementing the circuit.

There has been a strong demand for further miniaturization in the recent mobile communication terminal system, and it is necessary to form the power amplification apparatus in an one-chip form, even for satisfying such demand.

The present invention has been contemplated in consideration of the above-mentioned problems, and is configured to provide a power amplification apparatus and a mobile communication terminal apparatus which are capable of remarkably improving the operation efficiency, and further of integrating to be one-chip form.

SUMMARY OF THE INVENTION

One embodiment of a power amplification apparatus according to the present invention includes a first amplification element for amplifying an input signal, and a second amplification element for further amplifying the input signal amplified in the first amplification element and supplying to a first output terminal.

Further, in addition to these amplification elements, this embodiment further includes a first switch element performing on/off operation based on a control signal for setting the second amplification element in an operating condition by supplying the input signal from the first amplification element when on operation, and setting the second amplification element in an non-operating condition by not supplying the input signal from the first amplification element when off operation, and second switch element performing on/off operation based on a control signal but opposite to the operation of the first switch element for supplying the input signal from the first amplification element to a second output terminal when on operation, and for stopping the supply of the input signal to the second output terminal when off operation.

According to this embodiment of the present invention, the first switch element and the second switch element are operated in opposite relation to each other by a control signal. Specifically, when outputting a large power, the first switch element is controlled to be ON, and the second switch element is controlled to be OFF by the control signal.

Thereby, the input signal from the first amplification element is supplied to the second amplification element, the second amplification element is controlled to be ON-state, and the input signal amplified in multi-stage in the first amplification element and the second amplification element to be a large power is outputted.

On the contrary, when outputting a medium power, the first switch element is controlled to be OFF, and the second switch element is controlled to be ON by the control signal.

Thereby, the supply of the input signal from the first amplification element to the second amplification element is stopped, the second amplification element is controlled to be stopped condition, and the input signal amplified only by the first amplification element to be a medium power is outputted.

Accordingly, in a construction where the input signal is amplified in multi-stage, the amplification element (the second amplification element) in a later stage is made in operating condition when outputting a large power, and the amplification element in the later stage is stopped its operation when outputting a medium power, so that it is possible to improve a total operation efficiency of this power amplification apparatus.

Further, in another embodiment of the present invention, the first amplification element, the second amplification element, the first switch element, and the second switch element are formed by forming a high mobility electron channel near a hetero-junction between two semiconductor layers of a plurality of semiconductor layers stacked on a semiconductor substrate for forming a channel of a transistor, forming a contact semiconductor layer, which is a high mobility electron transistor having a gate electrode and is made of impurity doped semiconductor material, on at least one side surface of the plurality of the semiconductor layers, and forming a high mobility electron transistor a source electrode or a drain electrode of which is formed through an ohmic contact layer on the contact semiconductor layer.

In the high mobility electron transistor, the contact semiconductor layer is formed on a side surface of the plurality of semiconductor layers (a hetero-structure), and the ohmic contact layer is formed on the contact semiconductor layer. Accordingly, it is possible to reduce ON-resistance because there is no barrier layer having a high resistance within an operation current path.

Further, the contact semiconductor layer is made of conductive semiconductor material and is extended up to an upper surface of the hetero-structure, an ohmic contact is possible at this portion, and it is not necessary to dig the semiconductor material deeply by etching. Therefore, even the operation current is bypassed out of the barrier layer by providing the contact semiconductor layer, the increase of the occupied area is very few.

Accordingly, the power amplification apparatus is able to be configured to be one-chip form by applying the high mobility electron transistor as the first amplification element, the second amplification element, the first switch element, and the second switch element.

According to the present invention, it is possible to remarkably improve the operation efficiency of the power amplification apparatus. Further, it is able to integrate the power amplification apparatus into one-chip form.

DESCRIPTION OF THE PREFERRED EMBODIMENTS

Figure 1:
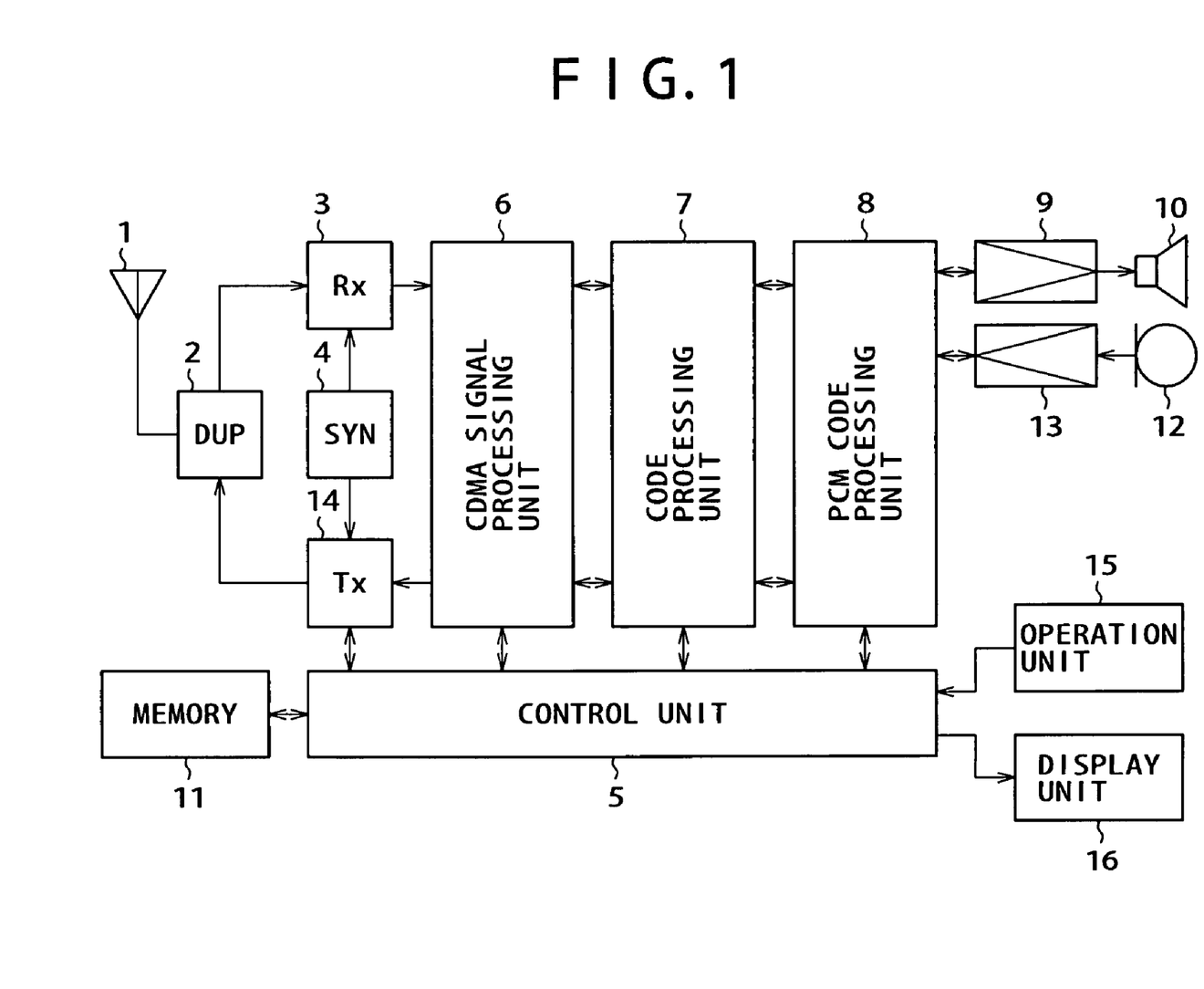
FIG. 1 is a block diagram of a mobile phone according to a first embodiment of the present invention.

The present invention is applicable to a mobile phone based on a W-CDMA (Wideband-Code Division Multiple Access) format as shown in FIG. 1.

First Preferred Embodiment (Overall Configuration and Operation of Mobile Phone)

A mobile phone according to a first preferred embodiment of the present invention receives a radio frequency signal transmitted from a base station through an antenna 1 at the time of its receiving. The radio frequency signal received through this antenna 1 is supplied to a receiver circuit 3 (RX) through an antenna duplexer (DUP) 2.

The receiver circuit 3 converts a radio frequency signal to an intermediate frequency signal by mixing a receiver local oscillation signal supplied from a frequency synthesizer (SYN) 4 with the radio frequency signal received through the antenna 1, and supplies it to a CDMA signal processing unit 6. By way of example, a frequency of the receiver local oscillation signal outputted from the frequency synthesizer 4 is controlled in response to a control signal from the control unit 5.

The CDMA signal processing unit 6 applies an orthogonal demodulation processing to the received intermediate frequency signal as well as a de-spreading processing thereto using a spread code (PN code) assigned to a reception channel so as to convert the received intermediate frequency signal to a received data in a predetermined format corresponding to its data rate then to be supplied to a code processing unit 7. By way of example, the CDMA signal processing unit 6 supplies information indicating a data rate of the received data to the control unit 5 as a received data rate.

The code processing unit 7, after applying a compression/decompression processing to the received data supplied from the CDMA signal processing unit 6 on the basis of a received data rate notified from the control unit 5, carries out a demodulation processing and an error correction demodulation processing using a Viterbi decoder or the like to reproduce the received data in a base band.

A PCM code processing unit 8 carries out a different signal processing depending on a type of communication (a voice communication or data communication) discriminated in the control unit 5.

More specifically, at the time of voice communication, the PCM code processing unit 8 applies a PCM demodulation processing to the received data supplied from the code processing unit 7 to output a received analogue signal therefrom. This received analogue voice signal is amplified in a received voice signal amplifier 9, and is annunciated through speaker 10.

Further, at the time of data communication, the PCM code processing unit 8 supplies a received data supplied from the code processing unit 7 to the control unit 5. The control unit 5 stores this received data in a memory (RAM) 11. And, the memory (RAM) 11 outputs the received data to a PDA (Personal Digital Assistance) or to a note-type personal computer through an external interface which is not shown, as required.

Then, at transmission, a voice of a speaker to be transmitted at the time of a voice communication is collected with a microphone 12, and is amplified in a voice amplifier 13 to an appropriate level. And after subjecting to a PCM coding processing in the PCM code processing unit 8, it is supplied to the code processing unit 7 as a transmission data.

At the time of this voice communication, the code processing unit 7 detects a quantity of energy for an input sound on the basis of the transmission data supplied from the PCM code processing unit 8, and determines a data rate on the basis of a result of the detection. Then, after compressing the transmission data into a burst signal in a format corresponding to the data rate described above, and further applying an error correction code processing thereto, supplies it to the CDMA signal processing unit 6.

Further, a data outputted from a PDA apparatus, a note-type personal computer, or an image data supplied from a digital camera apparatus are supplied to the control unit 5 through an external interface, then from the control unit 5 to the code processing unit 7 through the PCM code processing unit 8. Furthermore, data such as electronic mails (mail with mobile phone) is also supplied to the control unit 5, then from this control unit 5 to the code processing unit 7 through the PCM code processing unit 8.

The code processing unit 7, under the data communication, compresses the transmission data supplied from the PCM code processing unit 8 into a burst signal in a format corresponding to a preset data rate, and after applying an error correction coding processing thereto, supplies it to the CDMA signal processing unit 6.

By the way, the data rates at the times of the voice communication and the data communication are notified to the control unit 5 as a transmission data rate.

The CDMA signal processing unit 6 applies a spread code processing to the burst signal compressed in the code processing unit 7 using a PN code assigned to a transmission channel. Then, after applying an orthogonal modulation processing to the transmission signal which is spread-coded, this orthogonally modulated signal is then supplied to the transmitter circuit 14 (TX).

The transmitter circuit 14 converts the orthogonal modulation signal to a radio frequency signal by mixing it with a transmitter local oscillation signal supplied from the frequency synthesizer 4. Then, the transmitter circuit 14, on the basis of the transmission data rate notified from the control unit 5, and with a power amplification circuit to be described in detail later, amplifies only an effective part of the radio frequency signal to be output as a transmission radio frequency signal. This transmission radio frequency signal outputted from the transmitter circuit 14 is supplied to the antenna 1 through the antenna duplexer 2 for a burst transmission therefrom to the base station.

By the way, a predetermined input operation for inputting characters, codes, or the like is performed by operating the operation unit 15, and characters or images in a mail by mobile phone are displayed on the display unit 16.

(Constitution of a Power Amplification Circuit)

Figure 2:
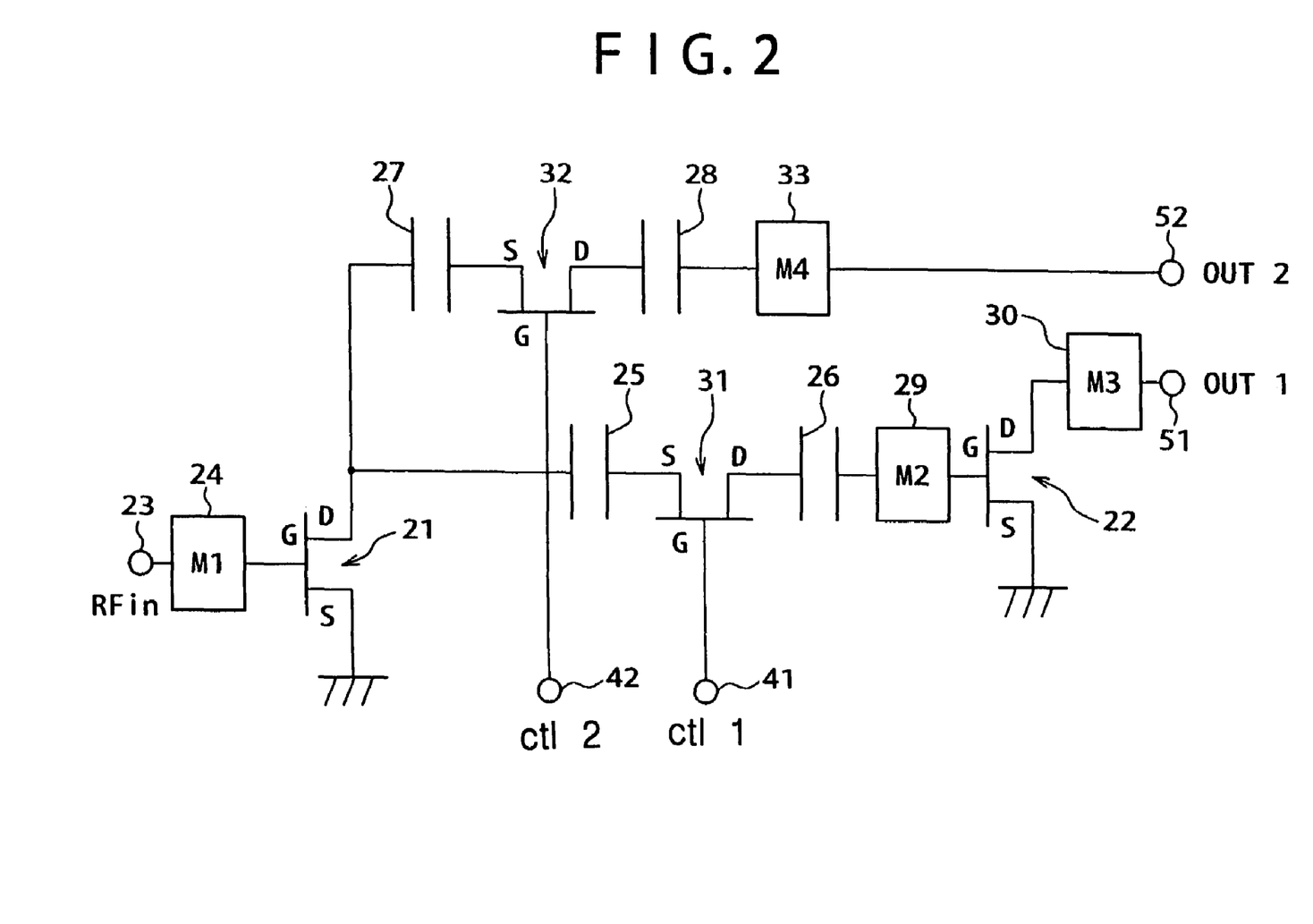
FIG. 2 is a circuitry diagram of a power amplification circuit provided in a transmission circuit of the above mobile phone.

The transmission circuit 14 in the mobile phone according to the embodiment of the present invention is configured to include a power amplification circuit as shown in FIG. 2. This power amplification circuit has two power amplification FETs (Field Effect Transistors) with a first power amplification FET 21 and a second power amplification FET 22, and two power switching FETs with a first switch FET 31 and a second switch FET 32.

More specifically, in this power amplification circuit, a first matching circuit 24 (M1) is connected between a gate (G) of the first amplification FET 21 the source (S) of which is grounded and an input terminal 23 (RFin), and a drain terminal (D) of the first amplification FET 21 is connected through a DC-cut capacitor 25 to a source of the first switching FET 31.

A drain of the first switching FET 31 is connected through a DC-cut capacitor 26 to an input terminal of a second matching circuit 29 (M2), and an output terminal of this second matching circuit 29 is connected to a gate of the second amplification FET 22 the source of which is grounded. A drain of the second amplification FET 22 is connected through a third matching circuit 30 (M3) to a first output terminal 51 (out 1).

Also, the drain terminal (D) of the first amplification FET 21 is connected through a DC-cut capacitor 27 to a source of the second switching FET 32. A drain of the second switching FET 32 is connected through a DC-cut capacitor 28 to an input terminal of a fourth matching circuit 33 (M4), and an output terminal of the fourth matching circuit 33 is connected to a second output terminal 52 (out 2).

And, a gate of the first switching FET 31 is connected to a first control terminal 41 (ctl 1) to which a switching control signal is supplied from the control unit 5 shown in FIG. 1, and a gate of the second switching FET 32 is connected to a second control terminal 42 (ctl 2) to which a switching control signal is supplied from the control unit 5 described above.

(Operation of the Power Amplification Circuit)

This power amplification circuit is arranged selectively to produce a transmission output by switching between a large power transmission output which is amplified in multi stages in the first amplification FET 21 as well as in the second amplification FET 22 (for outputting from the first output terminal 51) and an medium power transmission output which is amplified only by the first amplification FET 21 (for outputting from the second output terminal 52).

More specifically, in this exemplary embodiment, a range of the "medium power" is defined to be approximately from −60 dBm to 20 dBm, and a range of the "large power" is defined to be approximately from 21 dBm to 30 dBm, and when obtaining a large power transmission output, the control unit 5 described above supplies a control signal, for example, of 2.7 V to the first control terminal 41, and a control signal of 0 V to the second control terminal 42. Thereby, the second switching FET 32 to the gate of which the control signal of 0V is supplied is turned OFF, and the first switching FET 31 to the gate of which the control signal of 2.7 V is supplied is turned ON.

And, a transmission signal supplied through the input terminal 23 to the first amplification FET 21 is amplified therein, and is supplied therefrom through the first switching FET 31 to the second amplification FET 22 to be further amplified therein, thereby allowing it to be outputted as a large power transmission output, e.g., approximately of 28 dBm from the first output terminal 51.

On the other hand, when producing a medium power transmission output, the control unit 5 supplies a control signal, e.g., of 0V to the first control terminal 41 and a control signal of 2.7 V to the second control terminal 42. Thereby, the first switching FET 31 to the gate of which the control signal of 0 V is supplied is turned OFF, and the second switching FET 32 to the gate of which the control signal of 2.7 V is supplied is turned ON. And, a transmission signal supplied through the input terminal 23 is amplified in the first amplification FET 21 to be outputted from the second output terminal 52 as a medium power transmission output, for example, of 18 dBm.

By provisions of an output line for outputting a transmission output which is amplified in multi stages in the two elements, namely in the first amplification FET 21 and the second amplification FET 22 (the line from the first amplification FET 21 to the first output terminal 51) and an output line for outputting a transmission output which is amplified only in one element, namely in the first amplification FET 21 (the line from the first amplification FET 21 to the second output terminal 52), and also by controlling the first switching FET 31 and the second switching FET 32 inserted in connection with these lines selectively to turn ON and OFF, it is enabled to control for the second amplification FET 22 to become OFF-state during a medium power outputting so as to suppress power consumption. Thereby, during the medium power outputting, the power amplification circuit is ensured to be operable efficiently.

By the way, it is stated in the description of this embodiment that an operating efficiency of the power amplification circuit is improved by causing the control unit to apply a voltage (control signal) of 0 V to the gate of the first or the second switching FETs 31, 32 so that the first or the second switching FETs 31, 32 becomes OFF-state, however, it is not limited thereto, and a power supply itself to the first or the second switching FET 31 or 32 may be stopped to make either one of the switching FETs 31 and 32 OFF-state to the same effect.

(On-Chip Power Amplification Circuit)

(Constitution of JP-HEMT)

Here, it is to be noted that this power amplification circuit is provided as a one chip monolithic IC which is integrated on a gallium arsenide chip, which is implemented by using a HEMT (JP-HEMT) having a different structure from that of a conventional HEMT (High Electron Mobility Transistor) for respective FETs 21, 22, 31 and 32 described above.

Figure 3:
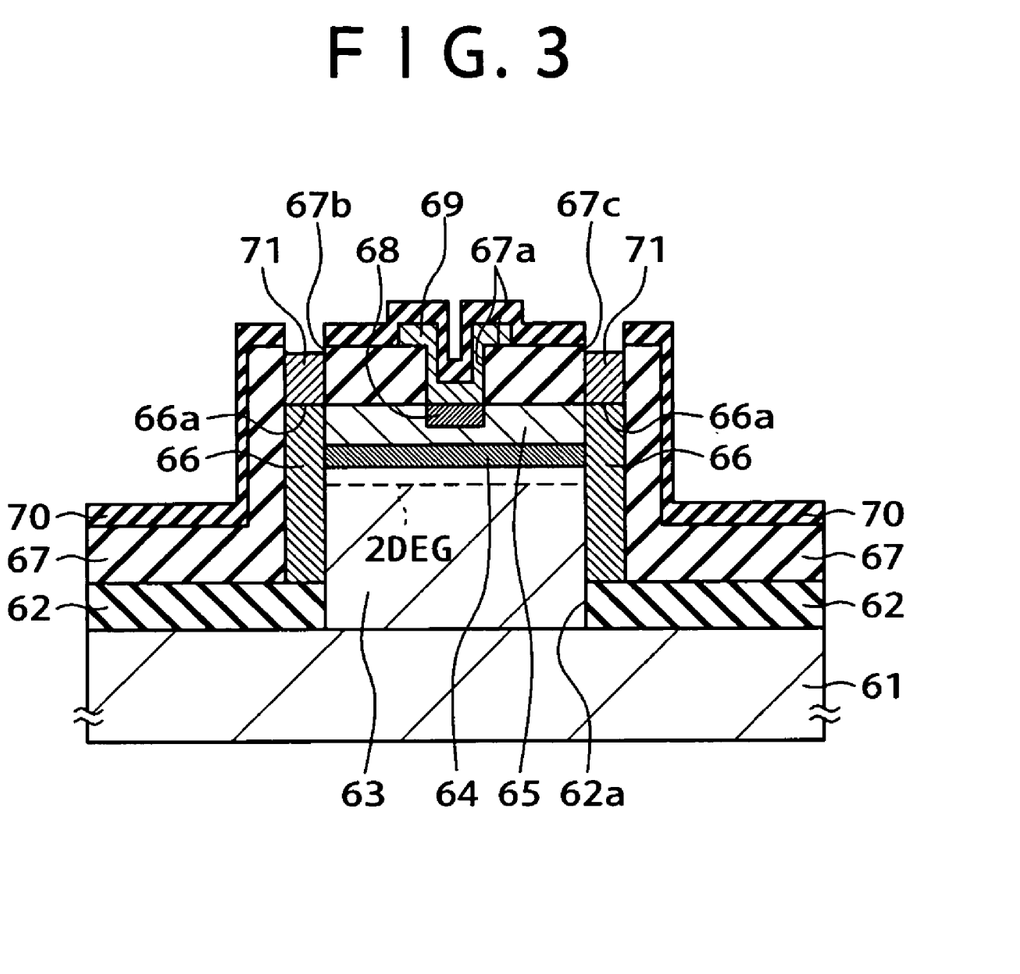
FIG. 3 is a cross-sectional diagram showing arrangements of respective FETs provided in the power amplification circuit.

FIG. 3 shows a cross-sectional view of this JP-HEMT. In the case of this JP-HEMT, a silicon oxide film 62 having an opening section 62a is formed on a semi-insulating semiconductor substrate 61.

Further, on a portion of the semiconductor substrate exposed by the opening section 62a, there are formed three semiconductor layers, i.e., a channel layer 63, a dope layer 64 and a barrier layer 65, by a selective epitaxial growth method, respectively.

These three semiconductor layers 63 to 65 are formed respectively such that, for example, the channel layer 63 is made of an undoped GaAs, the dope layer 64 is made of a n-type Alx Ga1-x As doped with Si (x=0.2 to 0.3), and the barrier layer 65 is made of an undoped Alx Ga1-x As.

Because there exists a difference in electron affinities between the materials of the dope layer 64 and the channel layer 63 as well as a difference in work functions therebetween as the n-type impurity (donor) is introduced into the dope layer 64, there occurs a bend at a discontinuity of energy in an energy band on a hetero junction plane under thermal equilibrium. This is because that electrons resulting from donors on the side of the dope layer 64 move into the channel layer 63 to cause a depletion of donors at an edge in the dope layer 64.

Because the electrons within the channel layer 63 are distributed in a very thin area in two-dimensions, they are referred to as "a two-dimension electron gas (2DEG)", and as a result that they are spatially isolated from the donors, i.e., the originator thereof, they are enabled to move very fast free from the influence of impurity scattering or the like. Hereinafter, this two-dimensional electron gas (2DEG) layer will be referred to as a "high mobility charge channel".

On both sides of the three semiconductor layers 63 to 65 protruding above the silicon oxide film 62, a contact semiconductor layer 66 which is made of GaAs into which a n-type impurity such as Si or the like is introduced is formed, respectively. This contact semiconductor layer 66 is provided for decreasing an ON resistance, and corresponds to a gap layer which is conventionally formed on the barrier layer 65.

The contact semiconductor layer 66, in a sense that it is provided for facilitating a flow of electrons without forming a hetero junction barrier, is preferably made of a same material as that of the channel layer 63. Further, an impurity concentration of the contact semiconductor layer 66 is preferably higher than the dope layer 64 in order to increase its conductivity.

An insulation film 67 made of, for example, silicon nitride is formed to cover the surfaces of the barrier layer 65 and the contact semiconductor layer 66.

A gate opening section 67a is formed in a portion in the silicon nitride film 67 and on the barrier layer 65, and a p-type gate impurity region 68 is formed in a surface area of the barrier layer 65 exposed by this opening section 67a.

Further, from within the gate opening section 67a onto the silicon nitride film 67, a gate electrode 69 made of, for example, Ti/Pt/Au or the like is formed. By a voltage applied to the gate electrode 69, the concentration of the two dimensional electron gas (2DEG) is modulated through the gate impurity region 68. On the gate electrode 69, an insulation film 70 made of, for example, silicon nitride is formed.

In two portions through the silicon nitride films 67, 70 and above the contact semiconductor layer 66, there are formed a source opening section 67b or a drain opening section 67c, and on a surface of the contact semiconductor layer 66 exposed by these opening section 67b, 67c, an ohmic connection layer 71 made of, for example, AuGe/Ni is formed, respectively. At least in a boundary between the ohmic connection layer 71 and the contact semiconductor layer 66 there is formed an alloy region 66a by heating, thereby accomplishing an ohmic contact. On the ohmic connection layer 71, a source electrode or a drain electrode which are not shown are formed, thereby, the JP-HEMT is formed.

In the case of the power amplification circuit described above, an upper layer wiring is formed further on this JP-HEMT through an interlayer insulation film so as to accomplish its on-chip system integration.

(Features and Effect of the JP-HEMT)

In the JP-HEMT having the configuration described above, its operating current (drain current) is supplied mainly to the two dimensional electron gas (2DEG) layer through the drain electrode, ohmic connection layer 71 and the contact semiconductor layer 66. Further, on the side of the source thereof, a drain current mainly from the two dimensional electron gas (2DEG) layer flows into the source electrode through the contact semiconductor layer 66 and the ohmic connection layer 71.

According to this JP-HEMT, because there is interposed no barrier layer 65 having a high resistance in the passage of the drain current, a source resistance and a drain resistance can be reduced, thereby enabling to minimize its ON resistance. Thereby, in comparison with a conventional HEMT, this JP-HEMP features a higher power, faster speed, lower noise and lower power consumption.

Further, because this JP-HEMT has such a configuration that its ohmic connection layer 71 having a limited thickness is not allowed directly to contact with the two dimensional electron gas layer in order to achieve a good ohmic characteristic, it is not necessary to fabricate a plurality of laminated semiconductor layers obliquely to expose an edge portion of the two dimensional electron gas layer by mesa etching or the like.

For a deep etching by mesa etching, some degree of area is required, however, because this JP-HEMT has a structure to place an ohmic contact on the upper end of the contact semiconductor layer 66, an increased area can be made minimum, thereby making it suitable for down-sizing. Therefore, by using the JP-HEMT as the FETs 21, 22, 31 and 32 described above, the power amplification circuit of the invention can be built on one chip.

Further, in the case where this power amplification circuit is constructed using HBTs (Hetero junction Bipolar Transistors) instead of these respective FETs 21, 22, 31 and 32 described above, although the HBT allows use of a plus power supply, it is difficult to build this power amplification circuit on one chip (the power amplification circuit is mounted on multi-chips). Further, in the case where a conventional HEMT is used as FETs 21, 22, 23 and 24, respectively, because the conventional HEMT needs the use a minus power supply, it is necessary specially to provide a minus power supply, and in addition, it becomes difficult to fabricate the power amplification circuit on one chip.

However, by constructing the power amplification circuit using the JP-HEMT as respective FETs 21, 22, 31 and 32 described above, advantageously, it becomes possible to fabricate the power amplification circuit on one chip. Further, in contrast to the conventional HEMT for use on a minus power supply, in the case of this JP-HEMT, it is operable on a plus power source. Therefore, by using this JP-HEMT as respective FETs 21, 22, 31 and 32 described above, a plus power supply from a battery of the mobile phone can be used as it is without the need of forming a minus power source in particular. Therefore, such a particular circuit for forming the minus power source can be omitted, thereby contributing to a compact and light-weight design of the apparatus through a simplified a circuit configuration of the mobile phone.

Effect and Advantage of the First Preferred Embodiment

As clearly understood from the description hereinabove, the mobile phone according to the first embodiment of the present invention has provided, in the power amplification circuit of the transmitter circuit 14, the line for outputting the transmission output which is amplified in multi-stages of the first amplification FET 21 and the second amplification FET 22 (the line from the first amplification FET 21 to the first output terminal 51) and the line for outputting the transmission output which is amplified only by the first amplification FET 21 (the line from the first amplification FET 21 to the second output terminal 52), and by selectively controlling the first switching FET 31 and the second switching FET 32, which are inserted in connection with these lines described above, to turn ON and OFF, it enables to suppress power consumption, for example, by controlling the second amplification FET 22 to be set in OFF state during an medium power output. Thereby, an overall operation efficiency of the power amplification circuit can be improved.

In particular, in the case of a mobile phone based on the W-CDMA method wherein a transmission power changes frequently, it is enabled efficiently to operate the power amplification circuit of the transmitter circuit 14 in response to this frequently changing transmission output, thereby achieving a remarkable effect.

Further, because the JP-HEMT is used as respective FETs 21, 22, 31 and 32 for constituting the power amplification circuit, thereby enabling for each FET 21, 22, 31 and 32 to be fabricated in a microstructure, the power amplification circuit can be formed on one chip.

Still further, because of the use of JP-HEMT which is operable on the plus power source for each FET 21, 22, 31, 32, it becomes possible to utilize the plus power directly from the battery of the mobile phone without the need of specifically forming the minus power source. Thereby, any additional circuit for forming the minus power source can be omitted, contributing to the compact and light-weight design of the apparatus through a simplification of the circuit configuration in the mobile phone.

Second Preferred Embodiment

Figure 4:
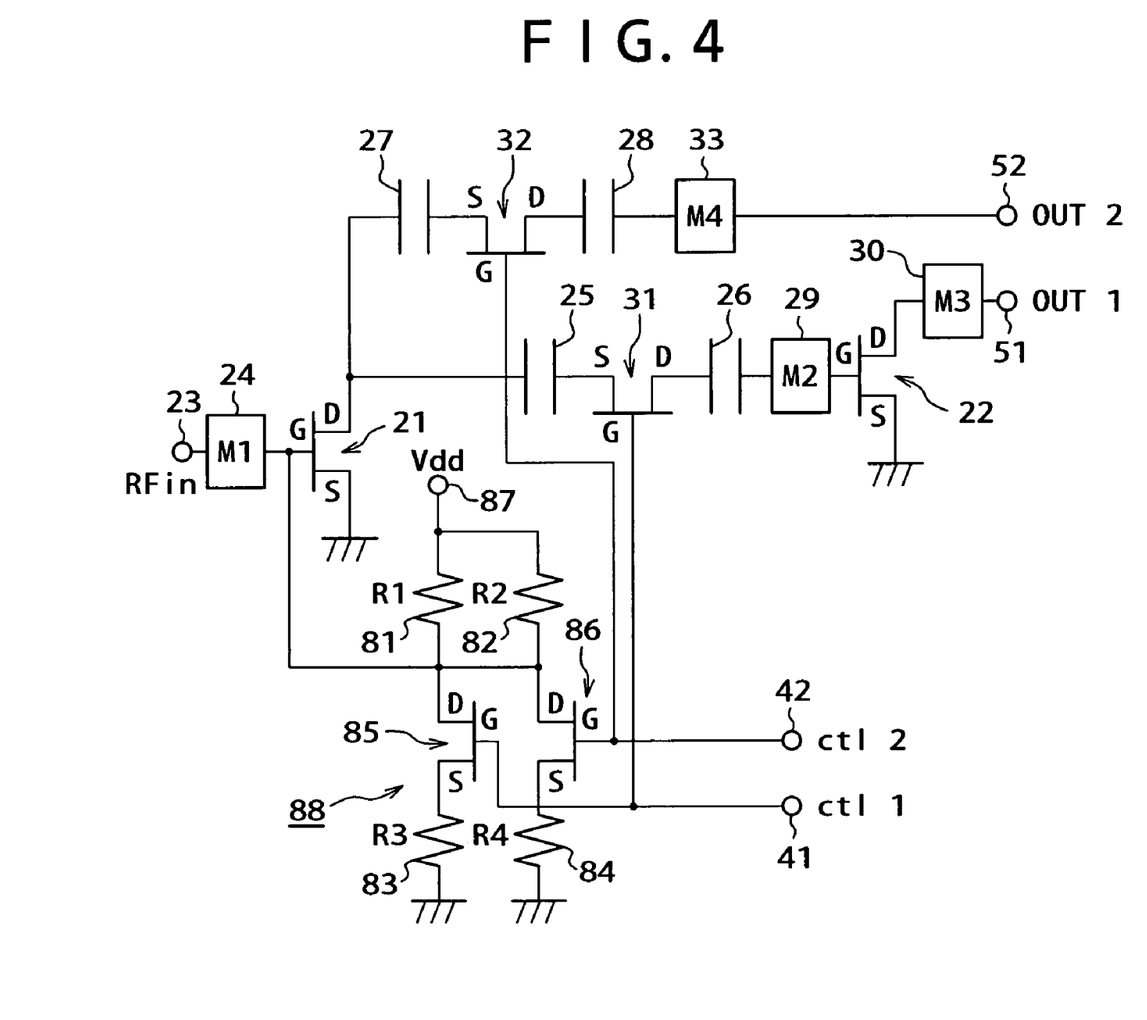
FIG. 4 is a circuitry diagram of a power amplification circuit provided in a transmission circuit in a mobile phone according to a second embodiment of the present invention.

Next, a mobile phone according to a second preferred embodiment of the present invention will be described. This mobile phone according to the second embodiment features a power regulation unit for regulating an output power of the first amplification FET provided in the power amplification circuit in the transmission circuit 14. By the way, the first embodiment and the second embodiment differ only in this respect. Thereby, in the following, only this difference will be described, omitting duplication of the description.

(Constitution of a Power Regulation Unit)

The mobile phone according to the second embodiment has a configuration as shown in FIG. 4, wherein a power regulation unit 88 is provided in a power amplification circuit within a transmission circuit 14 for regulating an output level of an medium power output to be outputted through a line from the first amplification FET 21 to the second output terminal 52, by regulating a gate voltage of the first amplification FET 21.

More specifically, this power regulation unit 88 has a first regulation FET 85 the source of which is grounded through a voltage dividing resistor 83 (R3) and likewise a second regulation FET 86 the source of which is grounded through a voltage dividing resistor 84 (R4).

A gate of the first regulation FET 85 is connected to a first control terminal 41 (ctl 1) which is connected to the gate of the first switching FET 31, and a gate of the second regulation FET 86 is connected to a second control terminal 42 (ctl 2) which is connected to the gate of the second switching FET 32.

Further, respective drains of respective regulation FETs 85, 86 are connected through a voltage dividing resistor 81 or a voltage dividing resistor 82 to a reference voltage supply terminal 87 to which a reference voltage (Vdd) is supplied. And, by connecting the gate of the first amplification FET 21 to a node between the voltage dividing resistor 81 and the drain of the first regulation FET 85 as well as to a node between the voltage dividing resistor 82 and the drain of the second regulation FET 86, the power regulation unit 88 is constructed.

By the way, the first regulation FET 85 and the second regulation FET 86 are also fabricated using the aforementioned JP-HEMT, and this power amplification circuit is also formed on one chip.

(Operation of the Power Regulation Unit)

In this power regulation unit 88, at the time when outputting a large power, the control unit 5 supplies a voltage, for example, of 2.7 V to the first control terminal 41, and a voltage of 0 V to the second control terminal 42. Thereby, the first switching FET 31 is turned ON and the second switching FET 32 is turned OFF as described above, so that a transmission signal supplied through an input terminal 23 is amplified in the first amplification FET 21 and the second amplification FET 22 to a large transmission power, for example, of approximately 28 dBm then to be outputted from the first output terminal 51.

Further, in this case, because that the first control terminal 41 is supplied, for example, with a voltage of 2.7 V, and the second control terminal 42 is supplied with a voltage of 0 V, the first regulation FET 85 in the power regulation unit 88 is turned ON-state, and the second regulation FET 86 therein is turned OFF-state. Thereby, to the gate of the first amplification FET 21 there is to be supplied a voltage with a value obtained by dividing a reference voltage supplied through the reference voltage supply terminal 87 by the voltage dividing resistors 81, 82 and 83.

In contrast, at the time of outputting a medium power, the control unit 5 supplies a voltage, for example, of 2.7 V to the second control terminal 42 and a voltage of 0 V to the first control terminal 41. Thereby, the first switching FET 31 is made OFF and the second switching FET 32 is made ON as described above, causing for a transmission signal supplied through the input terminal 23 to be amplified only in the first amplification FET 21 and outputted through the second output terminal 52.

Further, in this case, because that the second control terminal 42 is supplied a voltage, for example, of 2.7 V and the first control terminal is supplied a voltage of 0 V, the first regulation FET 85 of the power regulation unit 88 is set OFF, and the second regulation FET 86 is set ON. Thereby, to the gate of the first amplification FET 21 there is supplied a voltage with a value obtained by dividing the reference voltage supplied through the reference voltage supply terminal 87 by the voltage dividing resistors 81, 82 and 84.

Here, in this power regulation unit 88, respective values of respective voltage dividing resistors 81 to 84 are set such that there holds a relation "V1<V2" between a value of voltage V1 (=a voltage supplied to the gate of the first amplification FET 21 during outputting a large power) at the time when the reference voltage is divided by the voltage dividing resistors 81, 82, 83, and a value of voltage V2 (=a voltage supplied to the gate of the first amplification FET 21 during outputting a medium power) at the time when the reference voltage is divided by the voltage dividing resistors 81, 82, 84.

Thereby, at the time of outputting an medium power by amplifying the transmission signal only in the first amplification FET 21, by supplying a higher value of voltage to the gate of the first amplification FET 21, it is enabled to improve a value of power of the transmission signal, for example, to approximately 18 dBm during the outputting of this medium power.

Effects and Advantages of the Second Preferred Embodiment

As obviously understandable from the description hereinabove, the mobile phone according to the second embodiment of the invention is provided with the power regulation unit 88 capable of enhancing the value of voltage to be supplied to the gate of the first amplification FET 21 when the transmission signal is to be amplified only in the first amplification FET 21 before outputting as an medium power output, thereby enabling to improve the value of power of the transmission signal during the outputting of the medium power.

Thereby, even if a transmission power required increases very large, it becomes possible to cope with such a situation, and in addition, the same advantages and effects as those by the first embodiment can be obtained.

Third Preferred Embodiment

Figure 5:
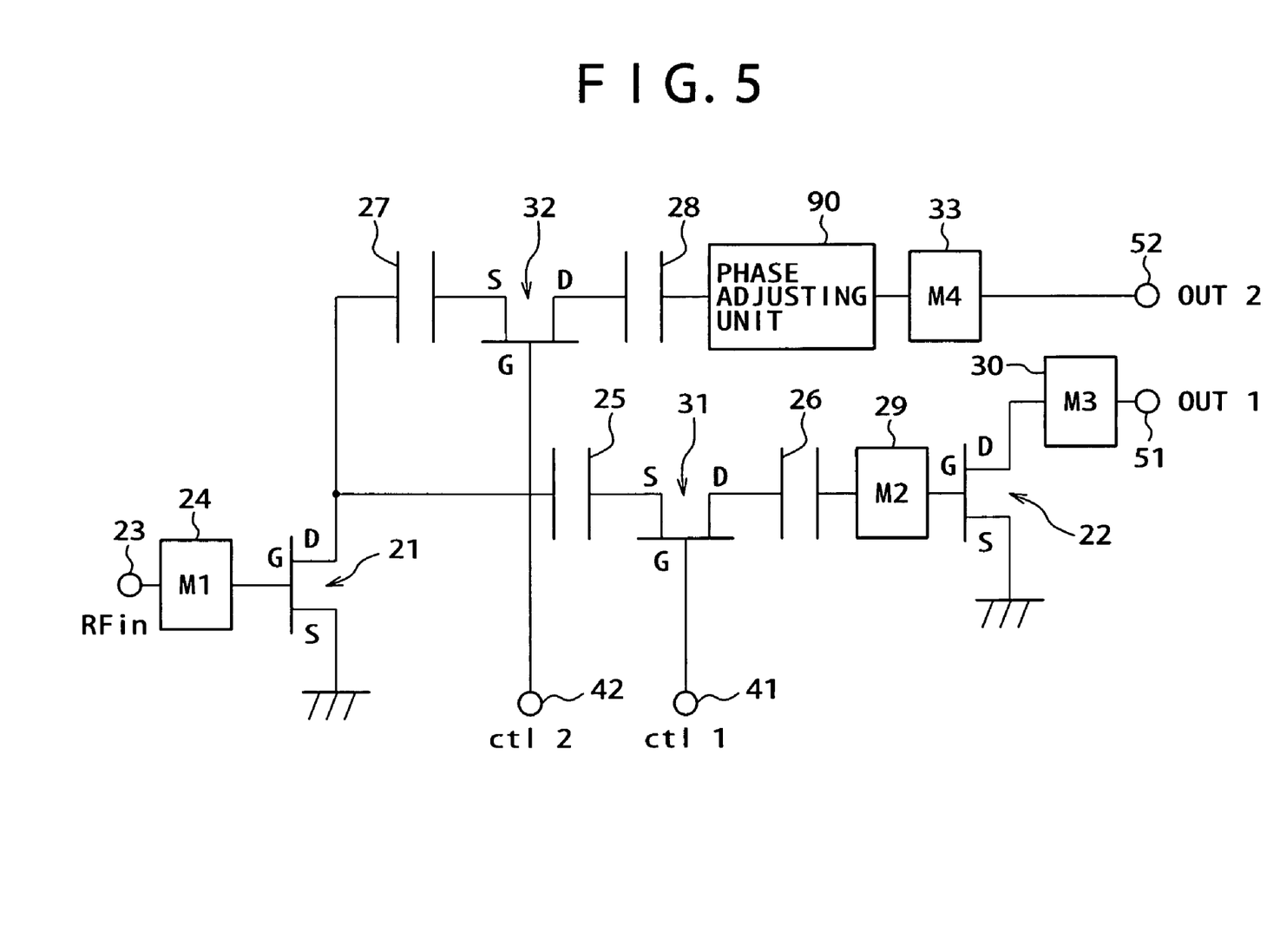
FIG. 5 is a circuitry diagram of a power amplification circuit provided in a transmission circuit in a mobile phone according to a third embodiment of the present invention.

In the next, a mobile phone according to a third preferred embodiment of the present invention will be described. The mobile phone according to the third embodiment features a phase adjusting circuit provided in the power amplification circuit of the transmitter circuit 14 for canceling a phase difference between a transmission signal to be outputted through the first output terminal 51 and a transmission signal to be outputted through the second output terminal 52.

By the way, the apparatus of the third embodiment differs from the preceding embodiments described above only in this respect. Therefore, only this difference will be described in the following description, omitting duplication of description.

Further, in the following description, an example of this phase adjusting circuit which is provided in the power amplification circuit of the mobile phone according to the first embodiment will be described.

Constitution of the Third Embodiment

In the mobile phone according to the third embodiment, as shown in FIG. 5, a phase adjusting circuit 90 is provided in the line connecting from the first amplification FET 21 to the second output terminal 52.

More specifically, the phase adjusting circuit 90 is inserted for connection between the DC-cut capacitor 28 which is connected to the drain of the second switching FET 32 and the fourth matching circuit 33 (M4).

By the way, in this example, although the phase adjusting circuit 90 will be described as provided on the side of the line connecting from the first amplification FET 21 to the second output terminal 52, it is not limited thereto, and it may be provided on the side of the line connecting from the first amplification FET 21 to the first output terminal 51 to the same effect.

Operation of the Third Embodiment

In the case of this power amplification circuit, when outputting a large power, a transmission signal is amplified in a total of two amplification FETs of the first amplification FET 21 and the second amplification FET 22. In contrast, when outputting a medium power, a transmission signal is amplified only in the first amplification FET 21 before its outputting. The transmission signal is rotated of its phase, for example, by 180 degrees through a single amplification FET.

Thereby, there results in a phase difference of 180 degrees between transmission signals of a high power output and a medium power output, therefore, the phase adjusting circuit 90 cancels this phase difference before outputting the transmission signal. That is, at the time of outputting a medium power, it rotates the phase of a transmission signal from the first amplification FET 21 by 180 degrees before outputting the same.

Effects and Advantages of the Third Embodiment

Thereby, it is enabled to output the transmission signals from the first output terminal 51 and the second output terminal 52 in the same phase, and in addition, the same effects and advantages according to the preceding embodiments are achievable.

Further, because the phase adjusting circuit 90 is provided in the line for use of outputting a medium power connecting between the first amplification FET 21 and the second output terminal 52, there results in no output loss in a transmission signal to be outputted from the line for use of outputting the high power (i.e., the line connecting between the first amplification FET 21 and the first output terminal 51), thereby enabling for a transmission signal amplified to a high power to be outputted as it is without a loss.

That is, when the phase adjusting circuit 90 is provided, there occurs a loss in its output more or less. Because it is preferable for the power which is amplified to a large power to be outputted as it is at the time of outputting the large power, in this example, the phase adjusting circuit 90 is installed in the line for use of outputting the medium power.

By way of example, if an output loss by the phase adjusting circuit 90 is within a permissible range, the phase adjusting circuit 90 may well be installed in the line for use of outputting the large power connecting between the first amplification FET 21 and the first output terminal 51 as described above.

In the hereinabove descriptions of respective embodiments, the mobile phone of the present invention has been set forth as applicable to the mobile phone of the W-CDMA method, however, it is not limited thereto, and it can be applied also to a mobile phone based on other methods such as the PDC method and the like, or to a communication terminal apparatus.

Further, in the above description of respective embodiments, although the present invention has been described as applied to the selection switch for switching between the plural outputs from the power amplification circuit, it is not limited thereto, and it can be applied to any other switching circuit for switching between its outputs, for example, an antenna switch circuit and the like as well.

In the last, the present invention is not limited to the exemplary embodiments disclosed hereinabove. Therefore, it should be understood that many changes, variations and combinations are possible in the design and the like thereof without departing from the scope of the present invention.

What is claimed is:

1. A power amplification apparatus comprising:
   a first amplification element for amplifying an input signal;
   a second amplification element for further amplifying the input signal amplified in the first amplification element and supplying to a first output terminal;
   a first switch element performing on/off operation based on a control signal for setting the second amplification element in an operating condition by supplying the input signal from the first amplification element when on operation, and setting the second amplification element in a non-operating condition by not supplying the input signal from the first amplification element when off operation; and
   a second switch element performing on/off operation based on a control signal but opposite to the operation of the first switch element for supplying the input signal from the first amplification element to a second output terminal when on operation, and for stopping the supply of the input signal to the second output terminal when off operation.

2. The power amplification apparatus as cited in claim 1, wherein the first amplification element includes a FET in which a source is connected to ground, and an output having a level amplified in response to the input signal supplied to a gate is derived from a drain; and further comprising:
   a power adjustment circuit for superposing a power adjustment signal having a level larger than that of when the control signal for setting the second amplification element into operating condition onto the input signal supplied to the gate of the first amplification element when the control signal for setting the second amplification element into non-operating condition is supplied to the first switch element.

3. The power amplification apparatus as cited in claim 1 or claim 2, further comprising:
   a phase adjustment circuit for adjusting so that a phase of the input signal amplified by the first amplification element and the second amplification element and supplied to thef first output terminal, and the input signal amplified only by the first amplification element and supplied to the second output terminal become the same phase.

4. The power amplification apparatus as cited in claim 1 or claim 2, including the first amplification element, the second amplification element, the first switch element, and the second switch element, is configured to be one chip formed based on a high mobility electron transistor formed by:
   forming a high mobility electron channel near a heterojunction between two semiconductor layers of a plurality of semiconductor layers stacked on a semiconductor substrate for forming a channel of a transistor;
   forming a contact semiconductor layer, which is a high mobility electron transistor having a gate electrode and is made of impurity doped semiconductor material, on at least one side surface of the plurality of the semiconductor layers; and
   forming a high mobility electron transistor a source electrode or a drain electrode of which is formed through an ohmic contact layer on the contact semiconductor layer.

5. A mobile communication terminal apparatus which converts a transmission output of a transmission signal by a power amplification circuit and transmits the transmission output, wherein
   the power amplification circuit comprises;
   a first amplification element for amplifying an input signal;
   a second amplification element for further amplifying the input signal amplified in the first amplification element and supplying to a first output terminal;
   a first switch element performing on/off operation based on a control signal for setting the second amplification element in an operating condition by supplying the input signal from the first amplification element when on operation, and setting the second amplification element in a non-operating condition by not supplying the input signal from the first amplification element when off operation; and
   a second switch element performing on/off operation based on a control signal but opposite to the operation of the first switch element for supplying the input signal from the first amplification element to a second output terminal when on operation, and for stopping the supply of the input signal to the second output terminal when off operation.

6. The mobile communication terminal apparatus as cited in claim 5, wherein
the first amplification element includes a FET in which a source is connected to ground, and an output having a level amplified in response to the input signal supplied to a gate is derived from a drain; and further comprising:
a power adjustment circuit for superposing a power adjustment signal having a level larger than that of when the control signal for setting the second amplification element into operating condition onto the input signal supplied to the gate of the first amplification element when the control signal for setting the second amplification element into non-operating condition is supplied to the first switch element.

7. The mobile communication terminal apparatus as cited in claim 5 or claim 6, further comprising:
a phase adjustment circuit for adjusting so that a phase of the input signal amplified by the first amplification element and the second amplification element and supplied to the first output terminal, and the input signal amplified only by the first amplification element and supplied to the second output terminal become the same phase.

8. The mobile communication terminal apparatus as cited in claim 5, or claim 6, including the first amplification element, the second amplification element, the first switch element, and the second switch element, is configured to be one chip formed based on a high mobility electron transistor formed by:
forming a high mobility electron channel near a heterojunction between two semiconductor layers of a plurality of semiconductor layers stacked on a semiconductor substrate for forming a channel of a transistor;
forming a contact semiconductor layer, which is a high mobility electron transistor having a gate electrode and is made of impurity doped semiconductor material, on at least one side surface of the plurality of the semiconductor layers; and
forming a high mobility electron transistor a source electrode or a drain electrode of which is formed through an ohmic contact layer on the contact semiconductor layer.

9. A power amplification apparatus comprising:
a first matching circuit provided between a gate terminal and an input terminal of a first grounded-source amplification FET;
a first switch FET a source terminal of which is connected to a drain terminal of the first grounded-source amplification FET through a DC-cut capacitor;
a second matching circuit connected to a drain terminal of the first switch FET through a DC-cut capacitor;
a second grounded-source amplification FET a gate terminal of which is connected to another terminal of the second matching circuit;
a third matching circuit connected to a drain terminal of the second grounded-source amplification FET;
a first output terminal connected to another terminal of the third matching circuit;
a second switch FET a source terminal of which is connected to the drain terminal of the first grounded-source amplification FET in parallel with the first switch FET through a DC-cut capacitor;
a forth matching circuit connected to a drain terminal of the second switch FET through a DC-cut capacitor;
a second output terminal connected to another terminal of the forth matching circuit;
a first control terminal connected to a gate terminal of the first switch FET; and
a second control terminal connected to a gate terminal of the second switch FET.

10. The power amplification apparatus as cited in claim 9, further comprising:
a first power adjustment FET to which a third dividing resistor is connected between a source terminal thereof and the ground; and
a second power adjustment FET to which a forth dividing resistor is connected between a source terminal thereof and the ground, wherein
a drain terminal of the first power adjustment FET is connected to a power source through a first dividing resistor;
a drain terminal of the second power adjustment FET is connected to a power source through a second dividing resistor;
a junction point where the drain terminals of the first power adjustment FET and the second power adjustment FET are connected to each other is connected between the gate terminal of the first grounded-source amplification FET and the first matching circuit;
each of the gate terminal of the first power adjustment FET and the gate terminal of the first switch FET is connected to the first control terminal; and
each of the gate terminal of the second power adjustment FET and the gate terminal of the second switch FET is connected to the second control terminal.

11. The power amplification apparatus as cited in claim 9, or claim 10, further comprising:
a phase adjustment circuit provided between a DC-cut capacitor connected to the drain terminal of the second switch FET and the forth matching circuit.

12. The power amplification apparatus as cited in claim 9, or claim 10, including the first and second grounded-source amplification FETs, and the first and second switch FETs, is configured to be one chip formed based on a high mobility electron transistor formed by:
forming a high mobility electron channel near a heterojunction between two semiconductor layers of a plurality of semiconductor layers stacked on a semiconductor substrate for forming a channel of a transistor;
forming a contact semiconductor layer, which is a high mobility electron transistor having a gate electrode and is made of impurity doped semiconductor material, on at least one side surface of the plurality of the semiconductor layers; and
forming a high mobility electron transistor a source electrode or a drain electrode of which is formed through an ohmic contact layer on the contact semiconductor layer.

* * * * *

UNITED STATES PATENT AND TRADEMARK OFFICE
CERTIFICATE OF CORRECTION

PATENT NO. : 7,224,221 B2
APPLICATION NO. : 11/050729
DATED : May 29, 2007
INVENTOR(S) : Tomoo Kobayashi et al.

It is certified that error appears in the above-identified patent and that said Letters Patent is hereby corrected as shown below:

Column 7, line 19, change "unit to" to --unit 5 to--.

Column 14, line 19, change "thef" to --the--.

Signed and Sealed this

Twentieth Day of November, 2007

JON W. DUDAS
*Director of the United States Patent and Trademark Office*